(12) United States Patent
Berry et al.

(10) Patent No.: US 7,921,399 B2
(45) Date of Patent: Apr. 5, 2011

(54) METHOD FOR SIMPLIFYING TIE NET MODELING FOR ROUTER PERFORMANCE

(75) Inventors: Christopher J. Berry, Hudson, NY (US); Michael Alexander Bowen, Kingston, NY (US)

(73) Assignee: International Business Machines Corporation, Armonk, NY (US)

( * ) Notice: Subject to any disclaimer, the term of this patent is extended or adjusted under 35 U.S.C. 154(b) by 534 days.

(21) Appl. No.: 12/032,823

(22) Filed: Feb. 18, 2008

(65) Prior Publication Data

US 2009/0210850 A1  Aug. 20, 2009

(51) Int. Cl.
    *G06F 17/50* (2006.01)
(52) U.S. Cl. .......................... 716/130; 716/119; 716/129
(58) Field of Classification Search .................... 716/13, 716/14
    See application file for complete search history.

(56) References Cited

U.S. PATENT DOCUMENTS

| | | | |
|---|---|---|---|
| 4,811,237 A * | 3/1989 | Putatunda et al. ................ 716/9 | |
| 5,187,671 A | 2/1993 | Cobb | |
| 5,313,079 A | 5/1994 | Brasen et al. | |
| 5,483,461 A * | 1/1996 | Lee et al. ......................... 716/14 | |
| 6,006,024 A | 12/1999 | Guruswamy et al. | |
| 6,691,296 B1 * | 2/2004 | Nakayama et al. ............. 716/15 | |
| 6,865,721 B1 | 3/2005 | Dahl et al. | |
| 7,191,424 B2 | 3/2007 | Dirks et al. | |
| 7,194,707 B2 | 3/2007 | Chung-Maloney et al. | |
| 7,194,717 B2 | 3/2007 | Andreev et al. | |
| 7,231,624 B2 | 6/2007 | Vuong et al. | |
| 7,281,232 B1 * | 10/2007 | Nicolino et al. ................. 716/12 | |
| 7,346,869 B2 * | 3/2008 | Tai et al. ......................... 716/5 | |
| 7,793,241 B2 * | 9/2010 | Tai et al. ......................... 716/5 | |
| 7,797,654 B2 * | 9/2010 | Tai et al. ......................... 716/5 | |
| 2001/0011362 A1 * | 8/2001 | Yoshinaga ........................ 716/8 | |
| 2004/0015804 A1 * | 1/2004 | Nakayama et al. ............. 716/10 | |
| 2005/0132321 A1 | 6/2005 | Shenoy et al. | |
| 2006/0080630 A1 * | 4/2006 | Lin .................................. 716/11 | |
| 2006/0095870 A1 * | 5/2006 | Tai et al. ......................... 716/1 | |
| 2006/0123374 A1 * | 6/2006 | Douriet .......................... 716/10 | |
| 2008/0052649 A1 * | 2/2008 | Tai et al. ......................... 716/5 | |
| 2008/0066026 A1 * | 3/2008 | Tai et al. ......................... 716/4 | |
| 2008/0082786 A1 * | 4/2008 | Lovell ............................ 712/15 | |

OTHER PUBLICATIONS

Naclerio et al., "Via Minimization for Gridless Layouts", 24th Conference on Design Automation, May 28-Jun. 1, 1987, pp. 159-165.*

* cited by examiner

*Primary Examiner* — Phallaka Kik
(74) *Attorney, Agent, or Firm* — William A. Kinnaman, Jr.

(57) ABSTRACT

A method for preprocessing tie net routing data organizes the data into a plurality of tie nets each based on an optimal connection path between a pin or set of pins and the power grid. The router then routs the data embodying the thusly-simplified plurality of tie nets. Once the routing is complete, post processor takes the routed design and returns it to its original net list state while keeping the routing solution.

17 Claims, 2 Drawing Sheets

METHOD FOR SIMPLIFYING TIE NET MODELING FOR ROUTER PERFORMANCE

FIELD OF THE INVENTION

This invention relates software programs known in the art as routers. That is, a program that determines the signal and power paths among elements of a large scale integrated circuit. More particularly, the invention relates to a novel method to organize the tie net data presented to the router program in order to improve router performance.

BACKGROUND OF THE INVENTION

As will be appreciated by those skilled in the art, a large-scale integrated circuit design is often used over and over again to implement different functional designs. This repeated use results in a large number (often thousands) of elements in the integrated circuit design that are not used for a specific functional design. These elements unused in a particular design are connected directly to a power signal, logical "1" or logical "0" and are referred to as being tied up (connected to logical one/vdd) or tied down (connected to logical 0/gnd).

In the prior art, unedited tie net data is used by the router to route the connections of an unused element to the power grid. This unedited tie net data lumps unused elements in single large tie net. Although these connections are not timing critical, and thus the respective routing paths for these connections is not critical, routing programs have difficulty in routing the tie net data as presented to the router in the prior art due to the massively parallel nature of the problem seen by the router in routing the tie net. A routing problem that is massively parallel can cause the router to come up with sub-optimal solutions and take a long time to complete.

SUMMARY OF THE INVENTION

An object of this invention is the provision of method of modeling the tie nets that preprocesses the design and edits the resulting net list so that the tie connections no longer appear to the router as a massively parallel problem and thus can be more simply and efficiently routed.

Briefly, this invention contemplates the provision of a method for preprocessing tie net routing data in which the preprocessing method organizes the data into a plurality of tie nets each based on an optimal connection path between a pin or set of pins and the power grid. The router then routs the data embodying the thusly-simplified plurality of tie nets. Once the routing is complete, post processor takes the routed design and returns it to its original net list state while keeping the routing solution.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

DETAILED DESCRIPTION OF THE INVENTION

As will be appreciated by those skilled in the art, present day large scale integrated circuit designs commonly use previously existing designs as the base hardware design consisting of logical elements and a power grid. The elements of the previously existing design are logically connected to carry out the functions of the new design. The router program determines the paths for the physical connections to make the logical connections called for in the new design. As explained above, many of the logical elements in the previously existing design are often not used in the new design an these elements are connected to a logic "1" or "0".

Definitions

Cell—A cell contains the implementation of a part of the logic being used in the design. It has blockages that indicate to the design containing it where its shapes are so they can be avoided and contains terminals that represent the points on the cell at which logical connections can be made to the logic.

Instance—Each unique usage of a cell is an instance. Each instance has its own instance name and instance terminals that are this instance's connections to the terminal of the cell.

Net—A net defines the connections between instance terminals that implement the logic of the design being implemented.

Router—A program that creates physical connections for a net. Electrically connecting the instance terminals together.

Figure 1:
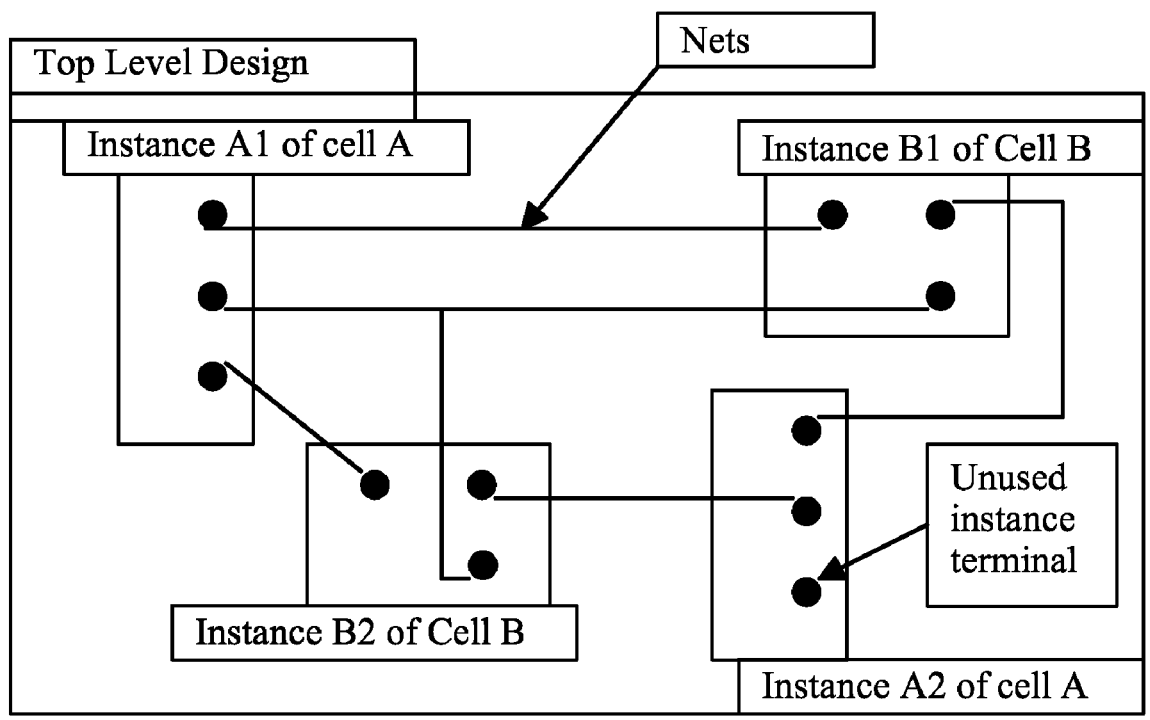
FIG. 1 is a block diagram that defines graphically some of the terms used in this application
Figure 2:
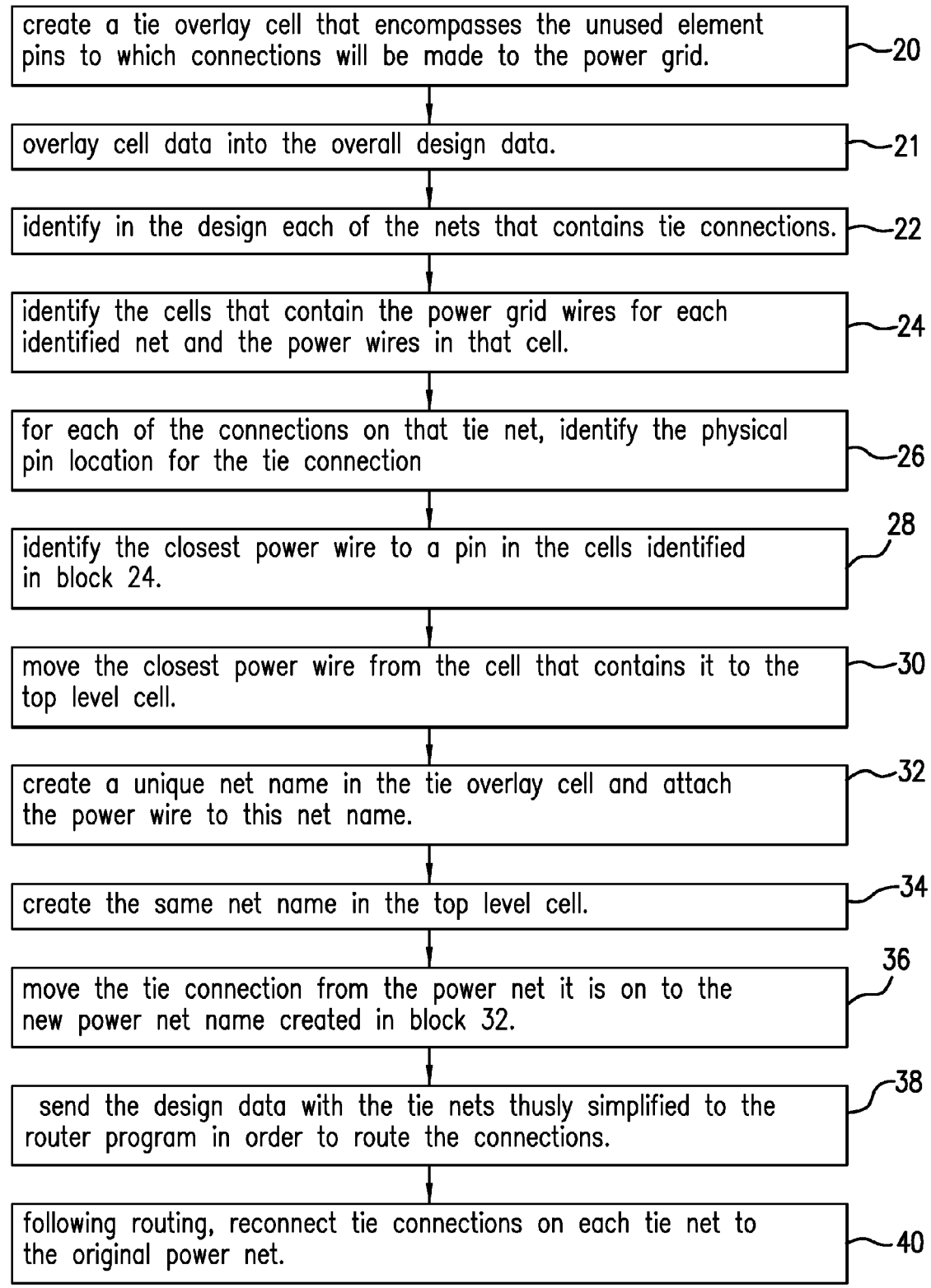
FIG. 2 is a flow chart of the pre-routing process to organize tie net data in accordance with the teachings of this invention.

Referring now to FIG. 2, the pre routing process for tie net in accordance with the teachings of this invention starts by creating a tie overlay cell that encompasses the shapes that will be removed from the power grid and used in the tie net routing, block 20. This overlay cell data is instantiated into the overall design data, block 21. For each of the pins that that need to be tied the associated power net is identified in the design (i.e. vdd for a tieup), block 22. The cells that contain the power grid wires for each identified net are identified and the power wires in that net are identified, block 24. For each of the unused instance terminals the physical pin location for the pin is identified (block 26) and the closest power wire identified from block 24 is identified, block 28. That closest power wire is moved (block 30) from the cell that contained it into the overlay cell created in block 20. A unique net name is created to represent this tie connection. A net with this name is created in the overlay cell and the power wire is attached to this net, block 32. Another net with this same name is created in the top design, block 34. The top level cell is the design being working on, and contains the placed cell instances and nets that connect them. The overlay cell is instantiated in this design as a place holder for the power grid shapes that will be moved around during processing. The unused instance terminal is detached from the power net it was associated with and attached to this net created in block 34, block 36. The design data with the tie nets thusly simplified is then sent to the router program in order to route the connections, block 38. Following routing the net list is returned to its original state, block 40. This encompasses removing the overlay cell, replacing the power shapes from the overlay cell back into their original locations, deleting the unique tie nets that were created in block 34, returning the unused instance terminals to the original power net they were connected to and moving the shapes the router created on the tie nets to this same original power net.

The capabilities of the present invention can be implemented in software.

As one example, one or more aspects of the present invention can be included in an article of manufacture (e.g., one or more computer program products) having, for instance, computer usable media. The media has embodied therein, for instance, computer readable program code means for providing and facilitating the capabilities of the present invention.

The article of manufacture can be included as a part of a computer system or sold separately.

Additionally, at least one program storage device readable by a machine, tangibly embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

The invention claimed is:

1. A method to organize tie net data presented to a router program in order to route tie connections in a tie net from a pin on an unused element to a power grid, including the steps of:
    for each tie connection on a tie net, identifying a physical pin location for the unused element;
    identifying a close power wire to the pin location identified in the previous step;
    moving the close power wire from a cell that contains it to a top level cell;
    creating a unique net name and attaching the close power wire to the unique net name; and
    moving the tie connection to the unique net name created in the creating and attaching step;
    wherein one or more of the steps of the method are performed by a computer.

2. A method to organize tie net data presented to a router program as in claim 1 including the further step of creating an overlay cell that encompasses unused element pins to which connections will be made to the power grid.

3. A method to organize tie net data presented to a router program as in claim 2 including the further step of instantiating the overlay cell into overall design data.

4. A method to organize tie net data presented to a router program as in claim 3 including the further step of identifying each net that includes a tie connection.

5. A method to organize tie net data presented to a router program as in claim 4 including the further step of sending the tie net data to the router program.

6. A method to organize tie net data presented to a router program as in claim 3 including the further step of sending the tie net data to the router program.

7. A method to organize tie net data presented to a router program as in claim 6 including the further step of returning a net list to an original state.

8. A method to organize tie net data presented to a router program as in claim 2 including the further step of identifying each net that includes a tie connection.

9. A method to organize tie net data presented to a router program as in claim 8 including the further step of sending the tie net data to the router program.

10. A method to organize tie net data presented to a router program as in claim 2 including the further step of sending the tie net data to the router program.

11. A method to organize tie net data presented to a router program as in claim 10 including the further step of returning a net list to an original state.

12. A method to organize tie net data presented to a router program as in claim 1 including the further step of identifying each net that includes a tie connection.

13. A method to organize tie net data presented to a router program as in claim 12 including the further step of sending the tie net data to the router program.

14. A method to organize tie net data presented to a router program as in claim 13 including the further step of returning a net list to an original state.

15. A method to organize tie net data presented to a router program as in claim 1 including the further step of sending the tie net data to the router program.

16. A method to organize tie net data presented to a router program as in claim 15 including the further step of returning a net list to an original state.

17. At least one program storage device readable by a machine, tangibly embodying at least one program of instructions executable by the machine to perform the method steps of claim 1.

* * * * *